(12) United States Patent
Inaba et al.

(10) Patent No.: US 9,893,006 B2
(45) Date of Patent: Feb. 13, 2018

(54) SEMICONDUCTOR MODULE

(71) Applicant: FUJI ELECTRIC CO., LTD., Kawasaki-shi, Kanagawa (JP)

(72) Inventors: Tetsuya Inaba, Matsumoto (JP); Yoshinari Ikeda, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/338,495

(22) Filed: Oct. 31, 2016

(65) Prior Publication Data

US 2017/0179018 A1 Jun. 22, 2017

(30) Foreign Application Priority Data

Dec. 16, 2015 (JP) .................................. 2015-245241

(51) Int. Cl.

| | |
|---|---|
| *H01L 23/498* | (2006.01) |
| *H01L 23/04* | (2006.01) |
| *H01L 23/373* | (2006.01) |
| *H01L 23/473* | (2006.01) |
| *H01L 25/07* | (2006.01) |

(52) U.S. Cl.
CPC ...... *H01L 23/49844* (2013.01); *H01L 23/041* (2013.01); *H01L 23/3735* (2013.01); *H01L 23/473* (2013.01); *H01L 23/49811* (2013.01); *H01L 25/072* (2013.01)

(58) Field of Classification Search
CPC . H01L 21/768; H01L 23/50; H01L 23/49844; H01L 23/49811; H01L 23/3735; H01L 23/041; H01L 23/473; H01L 25/072
See application file for complete search history.

(56) References Cited

U.S. PATENT DOCUMENTS 5,145,800 A * 9/1992 Arai .................... H01L 23/5286
257/503
6,545,322 B2 * 4/2003 Ishii ...................... H01L 27/027
257/355

FOREIGN PATENT DOCUMENTS

| | | |
|---|---|---|
| JP | 2007-019196 A | 1/2007 |
| WO | WO-2014/185050 A1 | 11/2014 |

* cited by examiner

*Primary Examiner* — Roy Potter
(74) *Attorney, Agent, or Firm* — Rabin & Berdo, P.C.

(57) ABSTRACT

A semiconductor module includes a plurality of semiconductor chips that include gate electrodes on front surfaces, a gate terminal that receives a control signal from outside, and a print substrate. The print substrate includes a gate wiring layer that separates the control signal that is input into the gate terminal and passes the control signal to the gate electrodes of the semiconductor chips, and a cross-sectional area of the gate wiring layer becomes larger as the gate wiring layer gets closer to the gate terminal from the gate electrodes.

9 Claims, 13 Drawing Sheets

SEMICONDUCTOR MODULE

CROSS-REFERENCE TO RELATED APPLICATION

This application is based upon and claims the benefit of priority of the prior Japanese Patent Application No. 2015-245241, filed on Dec. 16, 2015, the entire contents of which are incorporated herein by reference.

BACKGROUND OF THE INVENTION

1. Field of the Invention

The embodiments discussed herein relate to a semiconductor module.

2. Background of the Related Art

A semiconductor module includes a plurality of power semiconductor elements and is utilized as an electric power converter device or a switching device. For example, a semiconductor module is equipped with semiconductor chips connected in parallel, each of which includes an insulated gate bipolar transistor (IGBT), a metal oxide semiconductor field effect transistor (MOSFET), or the like, in order to function as a switching device.

For example, the semiconductor module includes an insulation substrate that includes an insulation plate, copper foils formed on a front surface and a back surface of the insulation plate, and a plurality of semiconductor chips located on the copper foil of the front surface of the insulation substrate. In addition, the semiconductor module includes a print substrate that is located opposite to the insulation substrate and includes patterned metal layers (wiring layers) formed on the front surface and the back surface of the print substrate. In this print substrate, there are formed conductive posts that are electrically connected with the wiring layers and electrically connected to gate electrodes and source electrodes of the semiconductor chips via the wiring layers (for example, refer to International Publication Pamphlet No. WO 2014/185050).

In this semiconductor module, a wiring layer that is electrically connected with the conductive posts is branched and electrically connected with the gate electrodes of the semiconductor chips. Hence, a control signal applied from outside to the conductive posts is input into the gate electrodes of the semiconductor chips via the wiring layer.

However, in the wiring layer for transmitting a control signal in the semiconductor module, its line width does not change from conductive posts for inputting a control signal to the gate electrodes of the semiconductor chips. Hence, the electric charge density in the wiring layer at the vicinity of the conductive posts for inputting a control signal is greater than the electric charge density in the branched wiring layer at the vicinity of the semiconductor chips, and the electric charge density varies depending on position in the wiring layer. Hence, when switching operation is performed by using high-frequency waves in particular, the electric charge moves significantly, so as to make Joule heat uneven depending on position in the wiring layer, and so as to make the semiconductor module less reliable due to thermal degradation.

SUMMARY OF THE INVENTION

According to one aspect, there is provided a semiconductor module including: a plurality of semiconductor chips including gate electrodes on front surfaces; a gate terminal configured to receive a control signal from outside; and a print substrate including a gate wiring layer for causing a control signal input into the gate terminal to separate and pass to the gate electrodes of the semiconductor chips, wherein a cross-sectional area of the gate wiring layer becomes larger as the cross-sectional area gets closer to the gate terminal from the gate electrodes.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Figure 1:
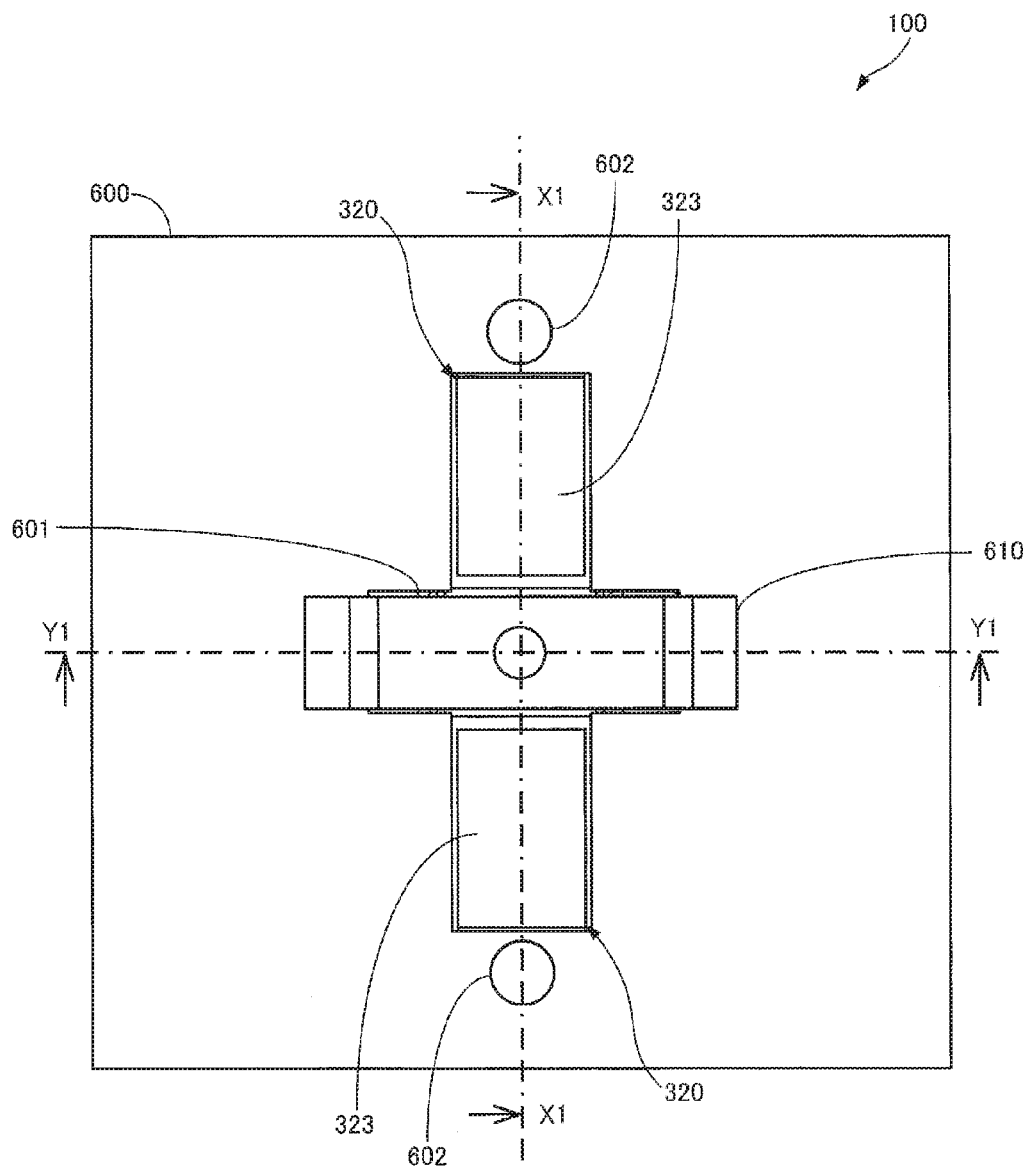
FIG. 1 is a top view of a semiconductor module of a first embodiment.

Several embodiments will be described below with reference to the accompanying drawings, wherein like reference numerals refer to like elements throughout.

[First Embodiment]

A semiconductor module of a first embodiment will be described with reference to FIGS. 1, 2A, and 2B.

FIG. 1 is a top view of the semiconductor module of the first embodiment.

Figure 2A:
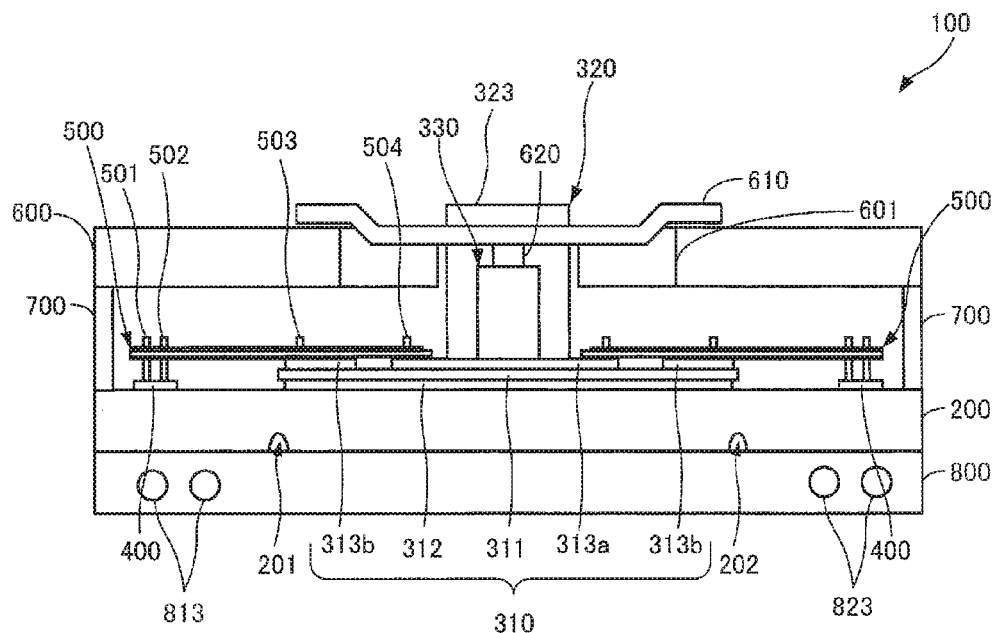
FIGS. 2A and 2B are cross-sectional views of a semiconductor module of the first embodiment.
Figure 2B:
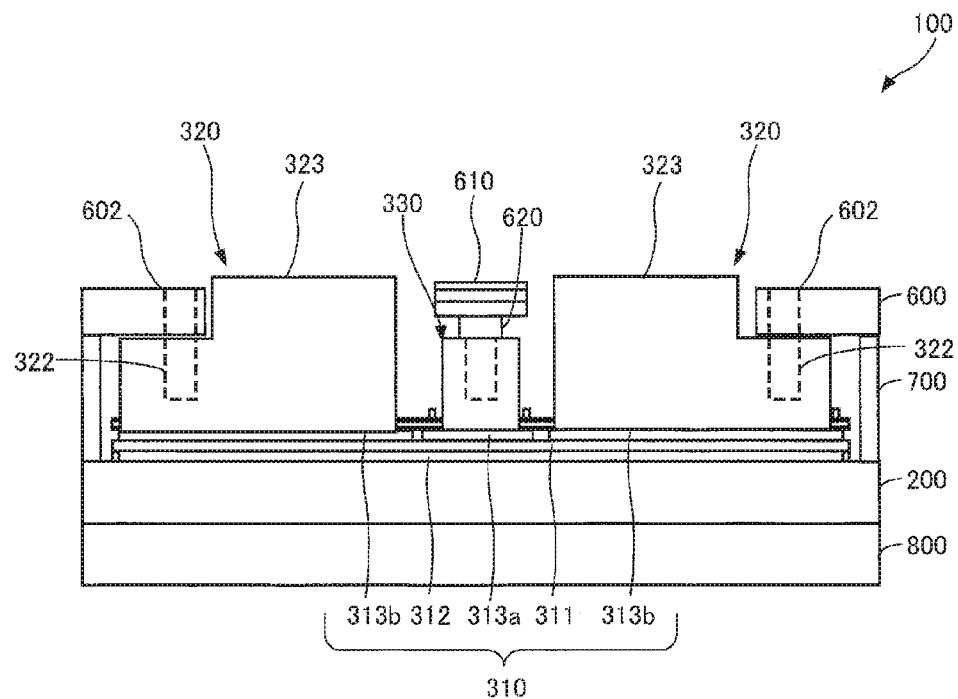

FIGS. 2A and 2B are cross-sectional views of the semiconductor module of the first embodiment.

Note that FIG. 2A is a cross-sectional view across a dot-and-dash line Y1-Y1 of FIG. 1, and FIG. 2B is a cross-sectional view across a dot-and-dash line X1-X1 of FIG. 1.

An uninsulated semiconductor module 100 includes a drain plate 200, a stacked substrate 310 located on a front surface of the drain plate 200, semiconductor chips 400 each including a MOSFET, as illustrated in FIGS. 1, 2A, and 2B.

Note that groove portions 201 and 202 are formed on a back surface of the drain plate 200 and traverse the drain plate 200. The semiconductor chips 400 are located on the front surface of the drain plate 200 outside the groove portions 201 and 202.

Also, in the stacked substrate 310, an insulation plate 311, a metal plate 312, a gate circuit plate 313a, and a circuit plate 313b are stacked.

Also, the semiconductor module 100 includes print substrates 500 and conductive posts 501 to 504, which are connection members for electrically connecting between the semiconductor chips 400 and the stacked substrate 310. Further, a gate terminal 330 is provided on the gate circuit plate 313a, and a pair of source terminals 320 are provided on the circuit plate 313b. Note that a gate contact 610 is connected to the gate terminal 330 via a gate supporting column 620. Also, the gate contact 610 is an electrically conductive elastic member.

A case 700 surrounds the semiconductor module 100 structure at side portions thereof, and a lid 600 including an opening 601 and holes 602 covers the semiconductor module 100 structure at an upper portion thereof. The gate contact 610 and the source terminals 320 are exposed from the opening 601, and the holes 602 are adjusted to the positions of screw holes 322 of the source terminals 320.

Further, a cooling device 800 is located on the back surface of the drain plate 200 of the semiconductor module 100. The cooling device 800 is made of metal that is superior in heat conduction, such as aluminum, gold, silver, copper, and the like. Cooling pipes 813 and 823 are formed inside the cooling device 800. Cooling water is supplied from an inlet into the cooling pipes 813 and 823 and is discharged from an outlet. The cooling pipes 813 and 823 are positioned beneath the semiconductor chips 400 and contribute to cooling of the semiconductor chips 400.

In this semiconductor module 100, a positive electrode of an external power supply (not illustrated) is connected to a back surface of the cooling device 800, and a negative electrode of the external power supply is connected to contact surfaces 323 of the source terminals 320. Also, in the semiconductor module 100, an outside control terminal (not illustrated) is connected to the gate contact 610, and a control signal is input into the gate contact 610 from the outside control terminal.

In the following, each component of the semiconductor module 100 will be described in detail with reference to FIGS. 3A and 3B to 8.

FIGS. 3A and 3B to 8 illustrate a configuration of the semiconductor module of the first embodiment.

Figure 3A:
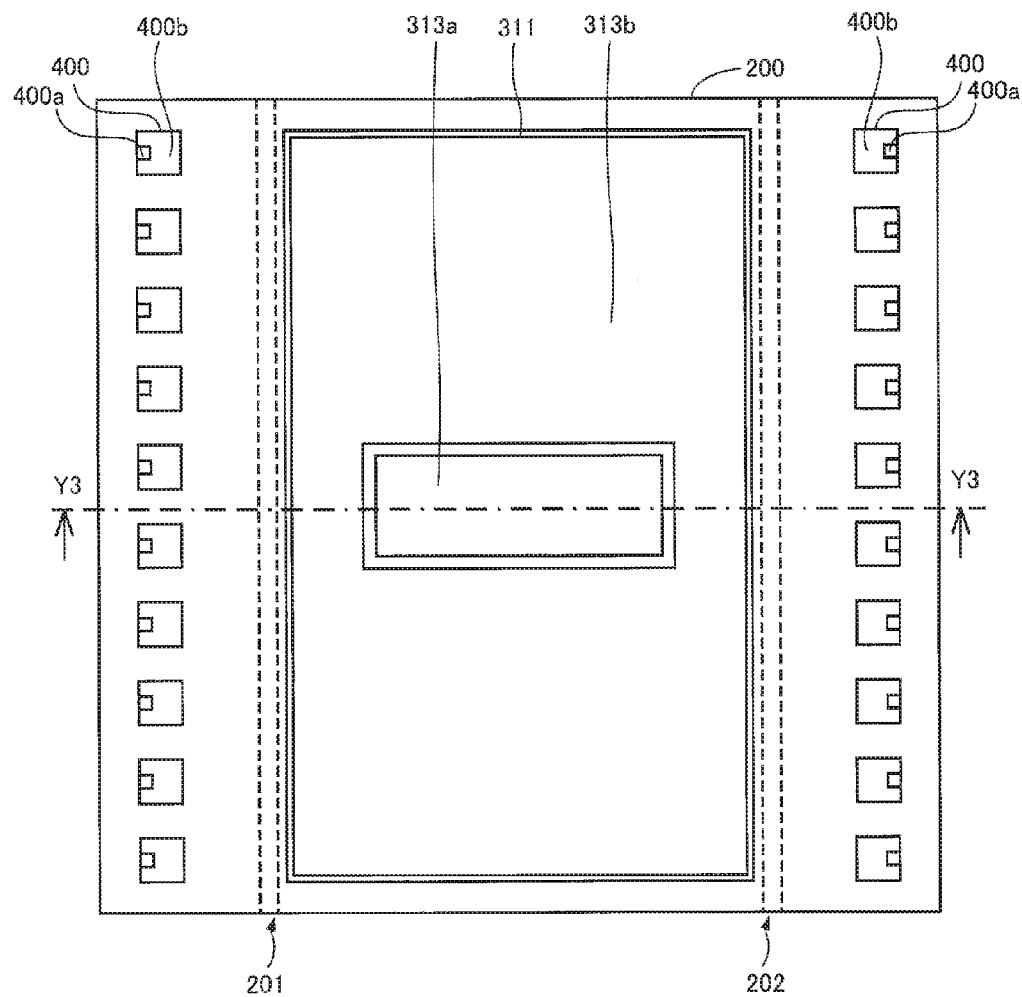
FIGS. 3A and 3B are first diagrams illustrating a configuration of a semiconductor module of the first embodiment.
Figure 3B:
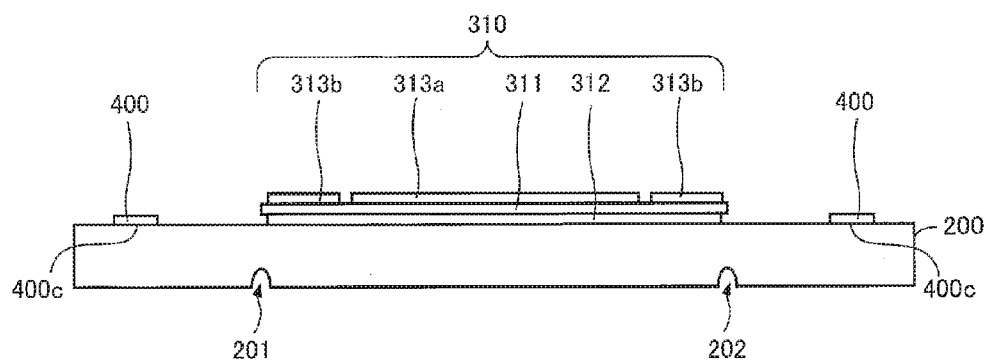
Figure 4:
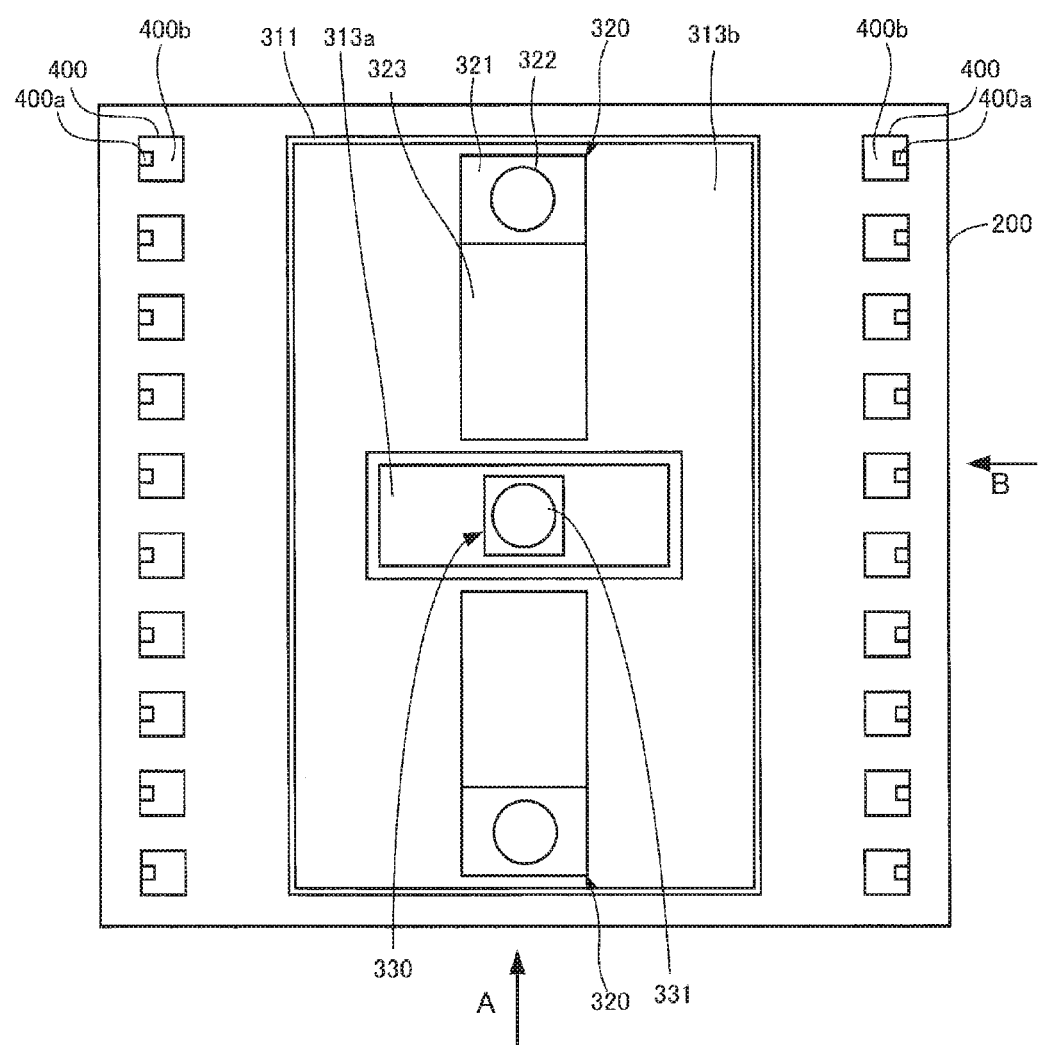
FIG. 4 is a second diagram illustrating a configuration of a semiconductor module of the first embodiment.
Figure 5A:
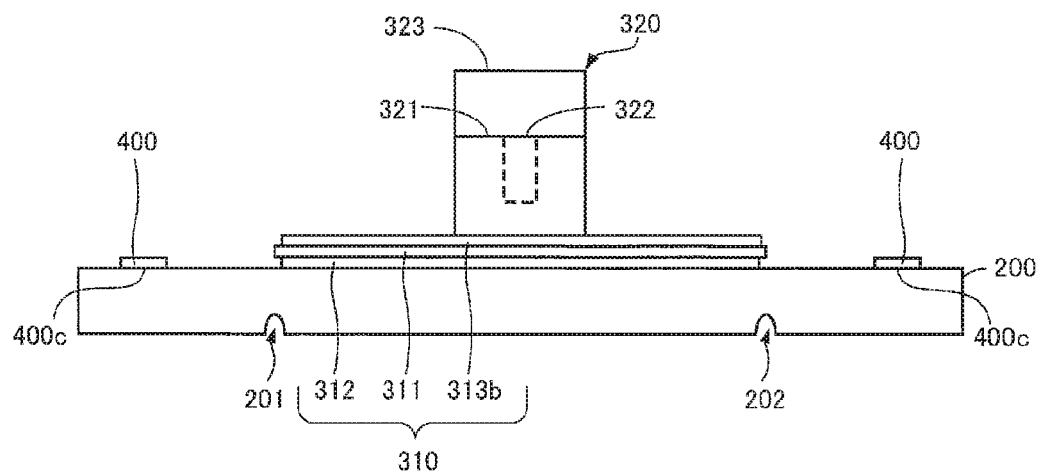
FIGS. 5A and 5B are third diagrams illustrating a configuration of a semiconductor module of the first embodiment.
Figure 5B:
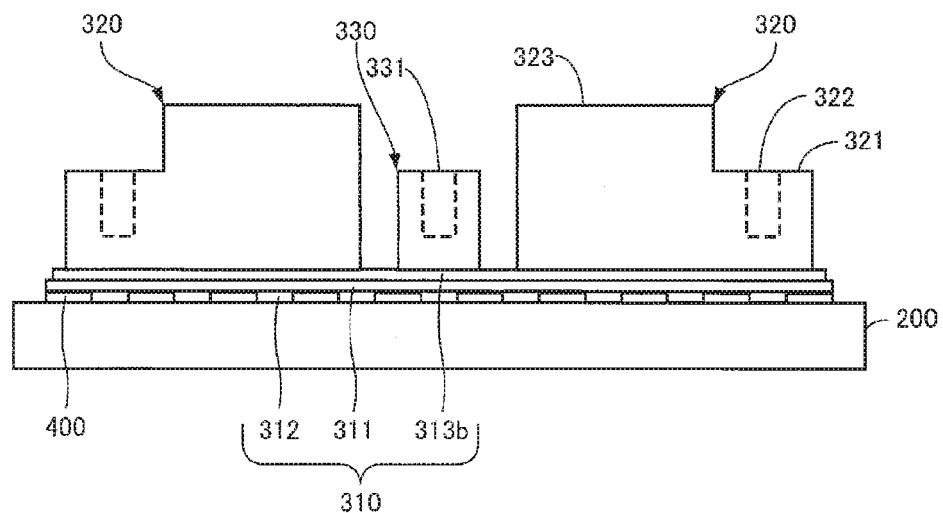

Note that FIG. 3B is a cross-sectional view across a dot-and-dash line Y3-Y3 in FIG. 3A. FIG. 5A is a diagram seen from an arrow A of FIG. 4, and FIG. 5B is a diagram seen from an arrow B of FIG. 4.

Figure 7:
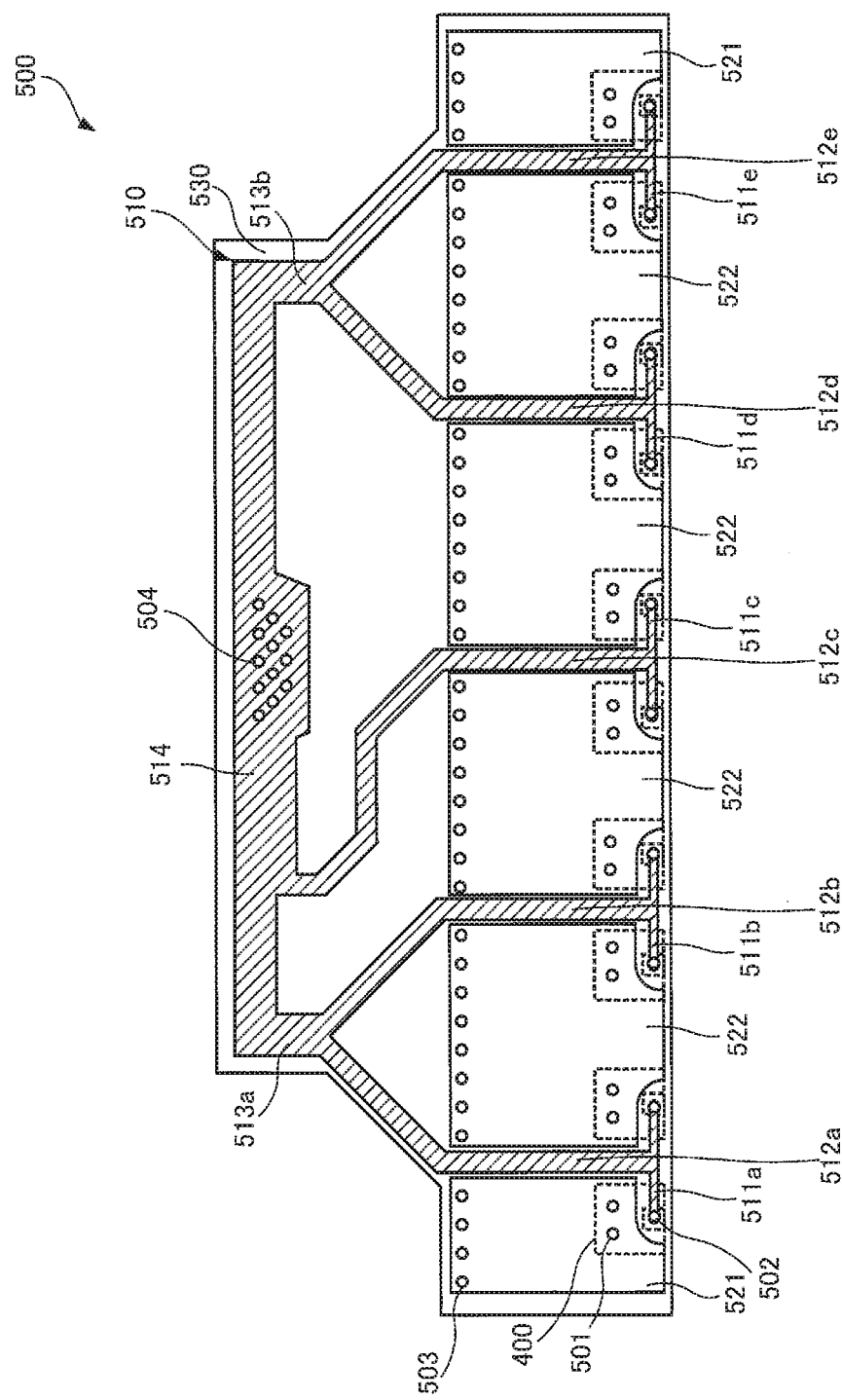
FIG. 7 is a fifth diagram illustrating a configuration of a semiconductor module of the first embodiment.
Figure 8:
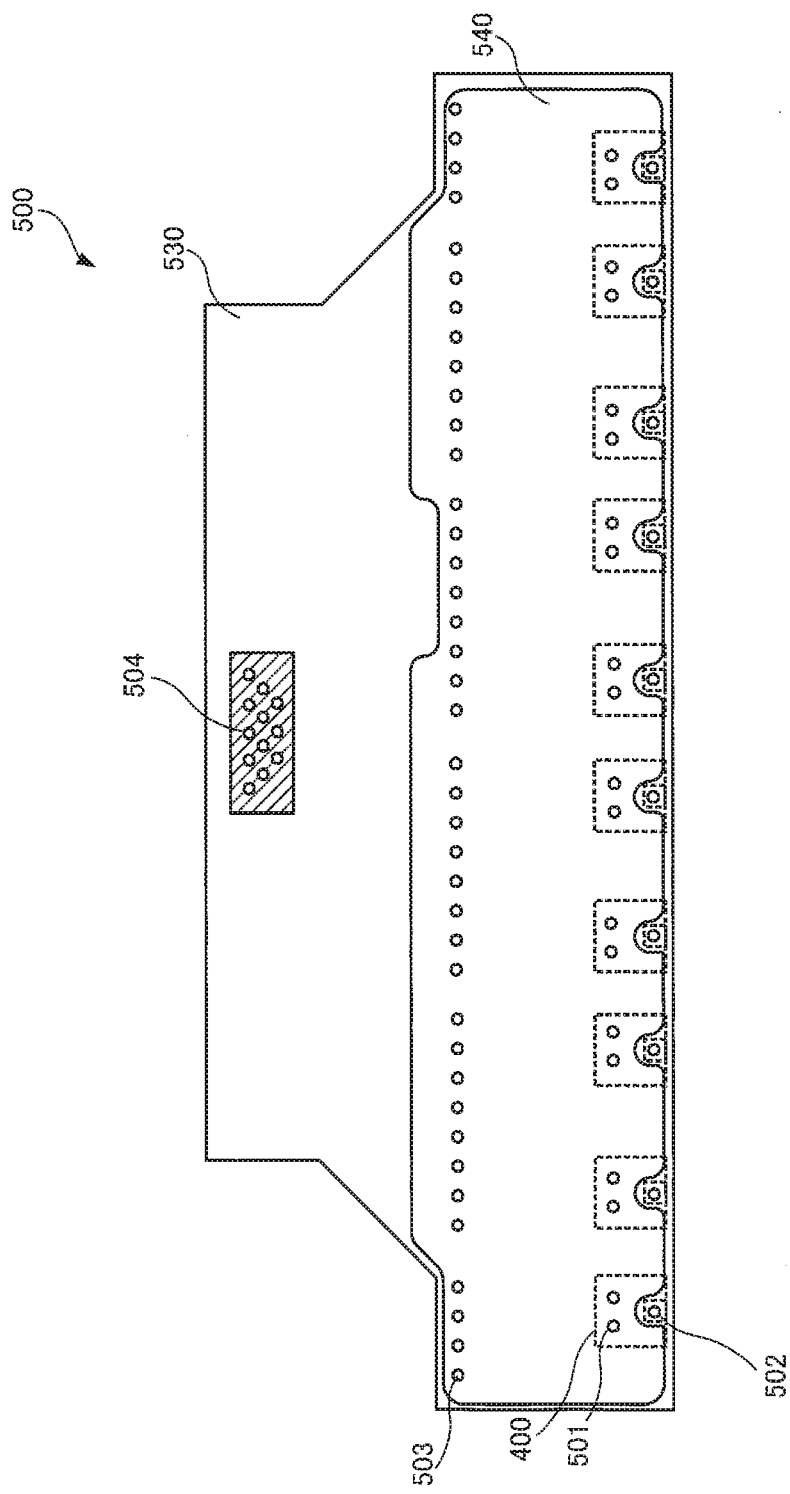
FIG. 8 is a sixth diagram illustrating a configuration of a semiconductor module of the first embodiment.

Also, FIG. 7 illustrates a gate wiring layer 510 formed on a front surface of a print substrate 500, and FIG. 8 illustrates a source wiring layer 540 formed on a back surface of the print substrate 500.

The drain plate 200 is made of conductive material, such as copper, as illustrated in FIGS. 3A and 3B. The groove portions 201 and 202 are formed on the back surface of the drain plate 200 and traverse the drain plate 200.

Also, the stacked substrate 310 is located in a region at the center of the front surface of the drain plate 200, which corresponds to the position between the groove portions 201 and 202, by means of soldering (not illustrated). The stacked substrate 310 includes an insulation plate 311, a metal plate 312, a gate circuit plate 313a located at the center of a front surface of the insulation plate 311, and a circuit plate 313b that surrounds the gate circuit plate 313a.

Each of the semiconductor chips 400 includes a power MOSFET made of a silicon carbide which is a wide band gap semiconductor, for example. Back surfaces (drain plate 200 side) of the semiconductor chips 400 include drain electrodes 400c, and front surfaces of the semiconductor chips 400 include source electrodes 400b and gate electrodes 400a. The semiconductor chips 400 are arrayed at a periphery portion of the front surface of the drain plate 200, so as to form straight lines each including 10 pieces of semiconductor chips 400, for example. The semiconductor chips 400 are fixed to the drain plate 200 by means of soldering (not illustrated), so that the drain plate 200 and the drain electrodes 400c are electrically connected to each other.

Also, the semiconductor chips 400 are located at positions corresponding to outside of the groove portions 201 and 202 on the drain plate 200. Compound (not illustrated) is applied to the back side of the drain plate 200 outside of the groove portions 201 and 202, in order to improve cooling efficiency.

Then, a pair of source terminals 320 are located on and electrically connected to the circuit plate 313b of the stacked substrate 310 as illustrated in FIGS. 4, 5A, and 5B. The source terminals 320 form cuboids and include stepped surfaces 321 that include the screw holes 322 as well as contact surfaces 323 to which an outside connection terminal is connected.

Also, the gate terminal 330 is located on and is electrically connected to the gate circuit plate 313a of the stacked substrate 310, by means of soldering (not illustrated). A fitting hole 331 into which the already-described gate supporting column 620 is fitted is formed in the gate terminal 330.

Also, the paired source terminals 320 and the gate terminal 330 are located straightly with respect to the stacked substrate 310.

Figure 6:
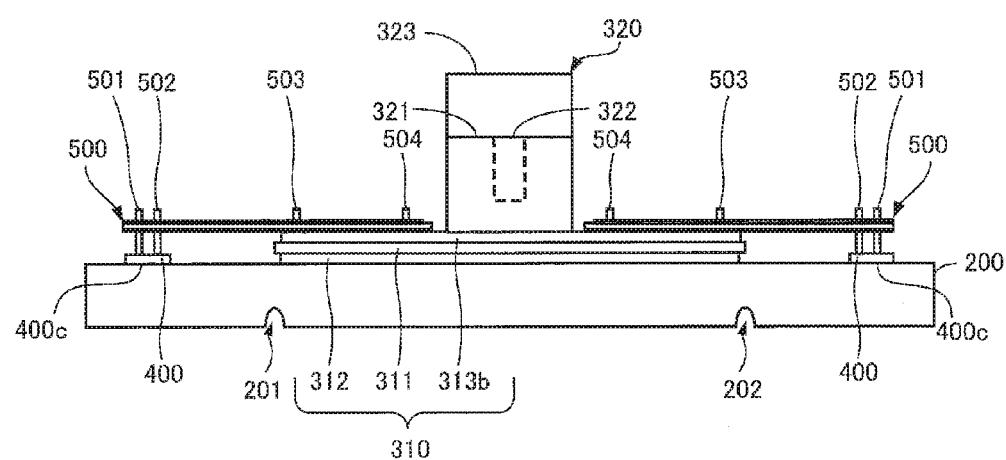
FIG. 6 is a fourth diagram illustrating a configuration of a semiconductor module of the first embodiment.

Then, as illustrated in FIGS. 6 to 8, the semiconductor chips 400 are electrically connected to the stacked substrate 310 (the gate circuit plate 313a and the circuit plate 313b (refer to FIGS. 3A and 3B)) by means of the connection members (the print substrates 500 and the conductive posts 501 to 504).

A gate wiring layer 510 of a print substrate 500 is formed on a front surface of an insulation plate 530 as illustrated in FIG. 7. The gate wiring layer 510 electrically connects the conductive posts 502 and the conductive posts 504. Also, the conductive posts 504 are electrically connected with the gate circuit plate 313a, and the conductive posts 502 are electrically connected with the gate electrodes 400a of the semiconductor chips 400 (MOSFETs). That is, the gate terminal 330 and the gate electrodes 400a of the semiconductor chips 400 are electrically connected via the gate wiring layer 510. Also, the gate wiring layer 510 is configured with line portions 511a, 511b, 511c, 511d, 511e, line portions 512a, 512b, 512c, 512d, 512e, line portions 513a and 513b, and a line portion 514.

Also, source wiring layers 521 and 522 of the print substrate 500 are formed on the front surface of the insulation plate 530 as illustrated in FIG. 7. Further, the source wiring layer 540 is formed on the back surface of the insulation plate 530 as illustrated in FIG. 8. These source wiring layers 521, 522, and 540 electrically connect the conductive posts 501 and the conductive posts 503. Also, the conductive posts 503 are electrically connected with the circuit plate 313b, and the conductive posts 501 are electrically connected with the source electrodes 400b of the semiconductor chips 400 (MOSFETs). That is, the source terminals 320 and the source electrodes 400b of the semiconductor chips 400 are electrically connected via the source wiring layers 521 and 522.

This inner structure of the semiconductor module 100 is surrounded by the case 700 as illustrated in FIGS. 1, 2A, and 2B. Then, the lid 600 is attached from the upper portion in such a manner that the source terminals 320 and the gate terminal 330 are exposed from the opening 601 of the lid 600, and that the holes 602 of the lid 600 are adjusted to the positions of the screw holes 322 of the source terminals 320. Also, the gate supporting column 620 to which the gate contact 610 is attached is fitted into the fitting hole 331 of the gate terminal 330. Thereby, the semiconductor module 100 is built. Further, the cooling device 800 is attached to the back surface of the drain plate 200.

As described above, the semiconductor module 100 is built.

Next, a gate wiring layer 510 formed in a print substrate 500 of the semiconductor module 100 will be described again with reference to FIG. 7.

The gate wiring layer 510 electrically connects the conductive posts 504 connected with the gate circuit plate 313a and the conductive posts 502 connected with the gate electrodes 400a of the semiconductor chips 400 as illustrated in FIG. 7. The gate wiring layer 510 connected to the gate circuit plate 313a branches a plurality of times toward the gate electrodes 400a of the semiconductor chips 400 and is electrically connected to the gate electrodes 400a.

Also, the gate wiring layer 510 has a constant thickness from the gate electrodes 400a of the semiconductor chips 400 to the gate circuit plate 313a.

On the other hand, each of the line portions 511a, 511b, 511c, 511d, 511e of the gate wiring layer 510 electrically connects the gate electrodes 400a of a pair of adjacent semiconductor chips 400. Each of the line portions 511a, 511b, 511c, 511d, 511e has a width of w1.

Also, the line portion 512a of the gate wiring layer 510 branches to the gate electrodes 400a of the semiconductor chips 400 through the line portion 511a, and has a width that is wider than the width w1 of the line portion 511a, in other words, has a width of w2 (=w1*2) equal to a combination of the widths w1 of the branched line portion 511a. In the same way, the line portions 512b, 512c, 512d, 512e also branch to the gate electrodes 400a of the semiconductor chips 400 through the line portions 511b, 511c, 511d, 511e, and have widths that are wider than the widths w1 of the line portions 511b, 511c, 511d, 511e, in other words, have widths w2 (=w1*2) equal to a combination of the widths w1 of the branched line portions 511b, 511c, 511d, 511e.

Also, the line portion 513a of the gate wiring layer 510 branches to the line portions 512a and 512b. The line portion 513a has a width that is wider than the width w2 of the line portions 512a and 512b, in other words, has a width w3 (=w2*2=w1*4) equal to a combination of the widths w2 of the branched line portions 512a and 512b. In the same way, the line portion 513b also branches to the line portions 512d and 512e, and has a width that is wider than the width w2 of the line portions 512d and 512e, in other words, has a width w3 (=w2*2=w1*4) equal to a combination of the widths w2 of the branched line portions 512d and 512e.

Also, the line portion 514 of the gate wiring layer 510 branches to the line portions 513a, 512c, 513b. The width of the line portion 514 becomes narrower, each time the line portion 514 branches to the line portions 513a, 512c, 513b. That is, the line portion 514 at the right side of FIG. 7 has a width w3 that is the same as the line portion 513b. Also, the line portion 514 at the left side of FIG. 7 has a width (w3+w2=w1*6) equal to a combination of the widths of the line portions 513a and 512c until the line portion 514 branches to the line portion 512c. Further, the line portion 514 has a width w3 that is the same as the line portion 513a after the line portion 514 branches to the line portion 512c.

Note that the line portion 512c is branched from the line portion 514, and further branches to the gate electrodes 400a of the semiconductor chips 400 through the line portion 511c, and is electrically connected to the gate electrodes 400a of the semiconductor chips 400. The line portion 512c obliquely extends between the line portion 511c and the line portion 514 in the same way as the line portions 512a, 512b, 512d, 512e, so as to connect the line portion 511c and the line portion 514. Thereby, the line portion 512c has the same length as the line portions 512a, 512b, 512d, 512e. Thus, the line portion 512c enables a control signal applied from the conductive posts 504 to reach the gate electrodes 400a of the semiconductor chips 400 at the same time point as the line portions 512a, 512b, 512d, 512e.

Thus, in the gate wiring layer 510, a control signal that is input from the conductive posts 504 separates to the line portion 513a (width w3=w1*4), the line portion 512c (width w2=w1*2), and the line portion 513b (width w3=w1*4) via the line portion 514.

A control signal that passes through the line portion 513a separates to the line portions 512a and 512b (width w2=w1*2), and further separates to two routes at the line portions 511a and 511b (width w1), and is input into the gate electrodes 400a of the semiconductor chips 400.

On the other hand, a control signal that passes through the line portion 512c also separates to two routes through the line portion 511c (width w1) and is input into the gate electrodes 400a of the semiconductor chips 400.

A control signal that passes through the line portion 513b separates to the line portions 512d and 512e (width w2=w1*2), and further separates to two routes through the line portions 511d and 511e (width w1), and is input into the gate electrodes 400a of the semiconductor chips 400.

As described above, the gate wiring layer 510 formed on the front surface of the insulation plate 530 of the print substrate 500 is electrically connected to the gate circuit plate 313a, and branches toward the gate electrodes 400a of the semiconductor chips 400 a plurality of times, and is electrically connected to the gate electrodes 400a of the semiconductor chips 400. Also, in the gate wiring layer 510, when the line portion 511a has the width w1 for example, the width w2 of the line portion 512a is a width (w1*2) equal to a combination of the widths w1 of the line portion 511a that is branched to two routes toward the gate electrodes 400a of the semiconductor chips 400 from the line portion 512a. That is, when the line portion branches into two, the width of the branched line portion is equal to a half of the width of the original line portion. As described above, a cross-sectional area of the gate wiring layer 510 for transmitting a control signal, i.e., the width of the line portion, becomes larger each time the line portion is merged as the line portion gets closer to the gate circuit plate 313a from the gate electrodes 400a of the semiconductor chips 400. That is, the width of the line portion becomes wider in the first embodiment. Thereby, the density of electric charge that passes through the gate wiring layer 510 is constant regardless of position in the gate wiring layer 510. Hence, Joule heat generated in the gate wiring layer 510 is constant and thus is prevented from becoming abnormally high in the gate wiring layer 510. Thus, the semiconductor module 100 is prevented from becoming less reliable, and its lifetime is made longer.

Also, as described above, the width of each line portion of the gate wiring layer 510 is optimized, and thus the source wiring layers 521 and 522 (FIG. 7) can be widened to the maximum. Hence, an output from the source wiring layers 521 and 522 can be increased to the maximum. Note that the width of the line portion 511a is preferably from 0.1 mm to 1.65 mm.

[Second Embodiment]

A second embodiment will be described, taking an example in which the width of a gate wiring layer of a print substrate is constant while the thickness of the gate wiring layer varies.

First, semiconductor chips of a semiconductor module of the second embodiment will be described with reference to FIG. 9.

Figure 9:
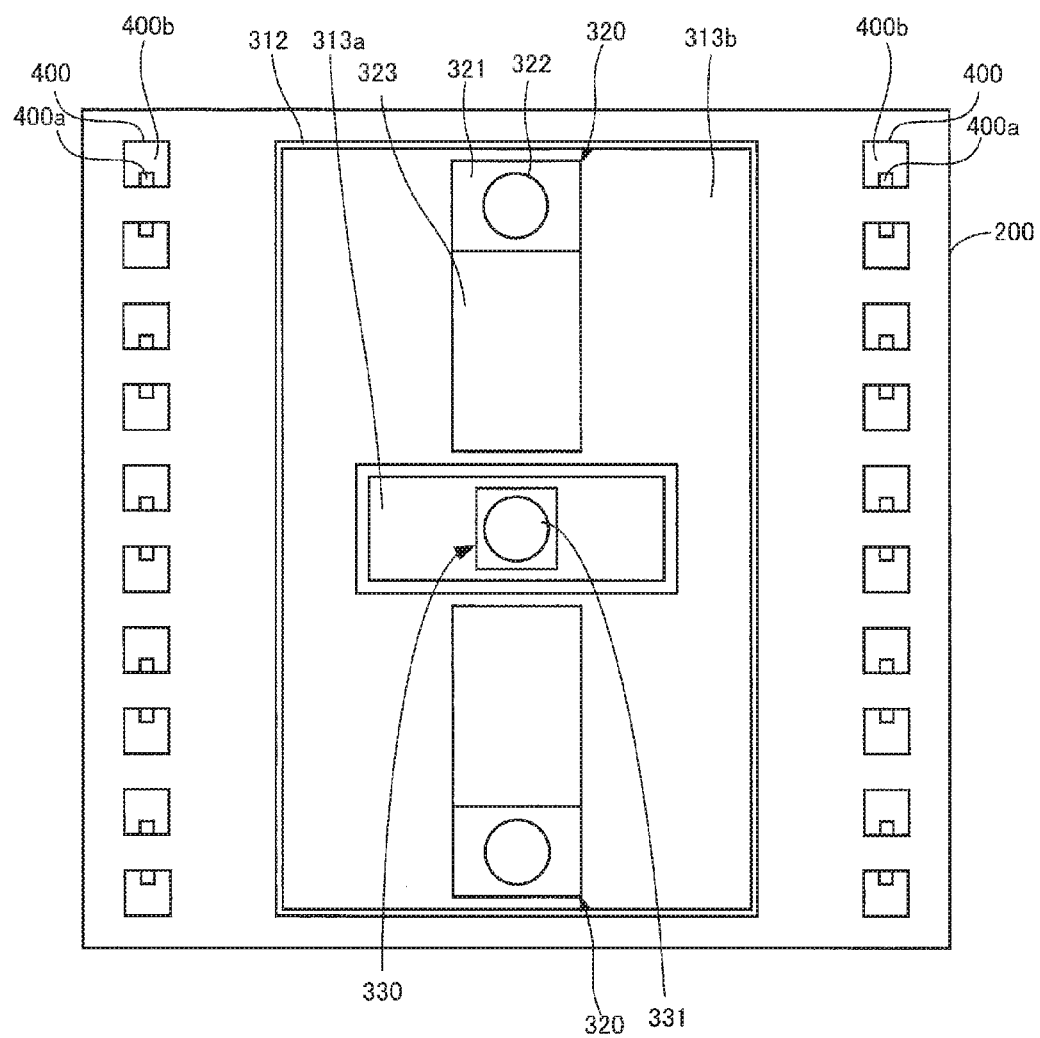
FIG. 9 illustrates a configuration of a semiconductor module of a second embodiment.

FIG. 9 illustrates a configuration of the semiconductor module of the second embodiment.

The semiconductor module of the second embodiment has the same configuration as the first embodiment, except for the print substrates 500 of the semiconductor module 100 of the first embodiment. Note that, in the semiconductor module of the second embodiment, the orientations of the semiconductor chips 400 are different from the orientations (refer to FIGS. 3A and 3B) of the semiconductor chips 400 in the semiconductor module 100 of the first embodiment as illustrated in FIG. 9.

Next, the print substrate in the semiconductor module of the second embodiment will be described with reference to FIGS. 10 and 11.

Figure 10:
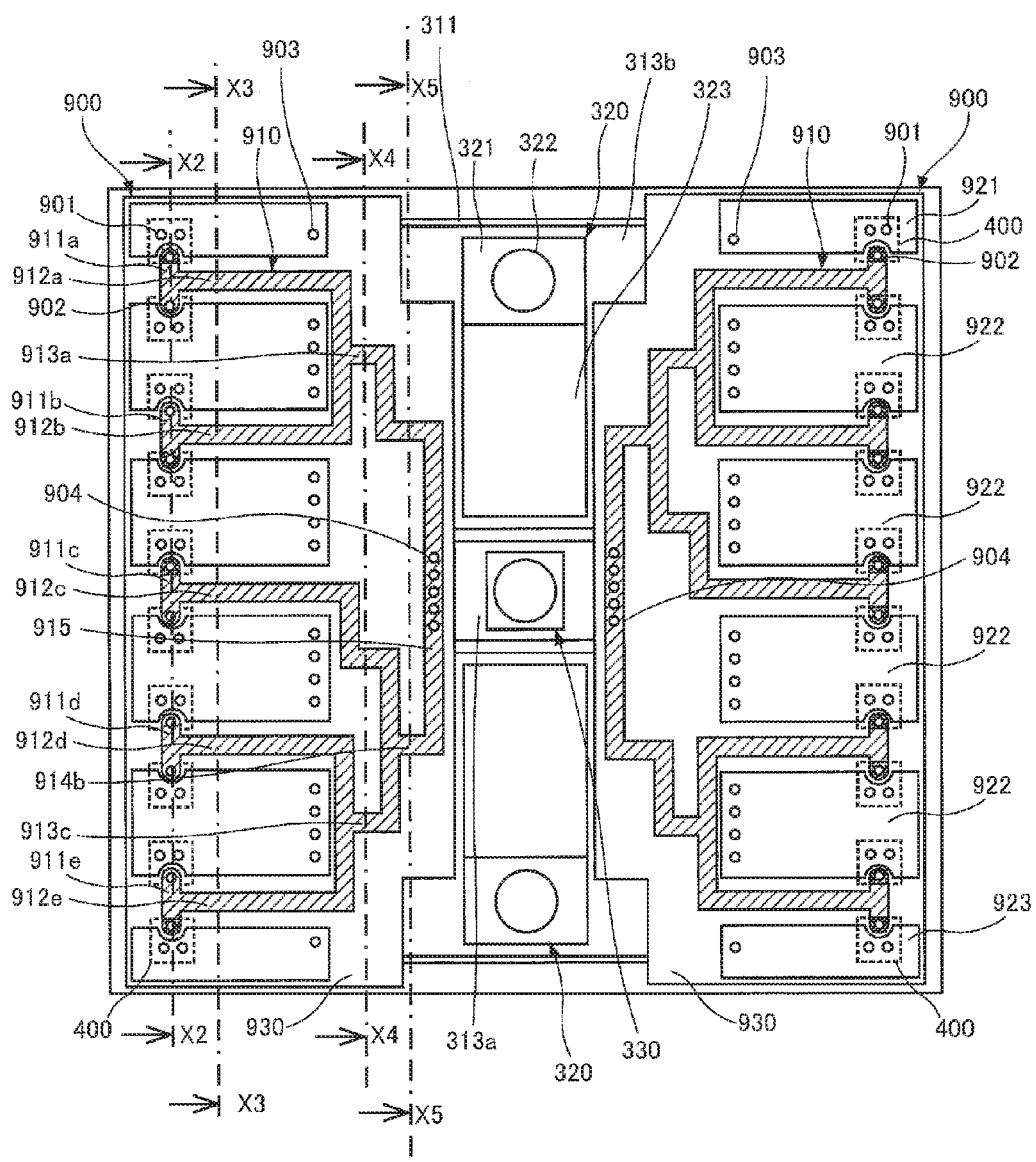
FIG. 10 is a top view (a front surface) of a print substrate of a semiconductor module of the second embodiment.

FIG. 10 is a top view (a front surface) of the print substrate of the semiconductor module of the second embodiment.

Figure 11:
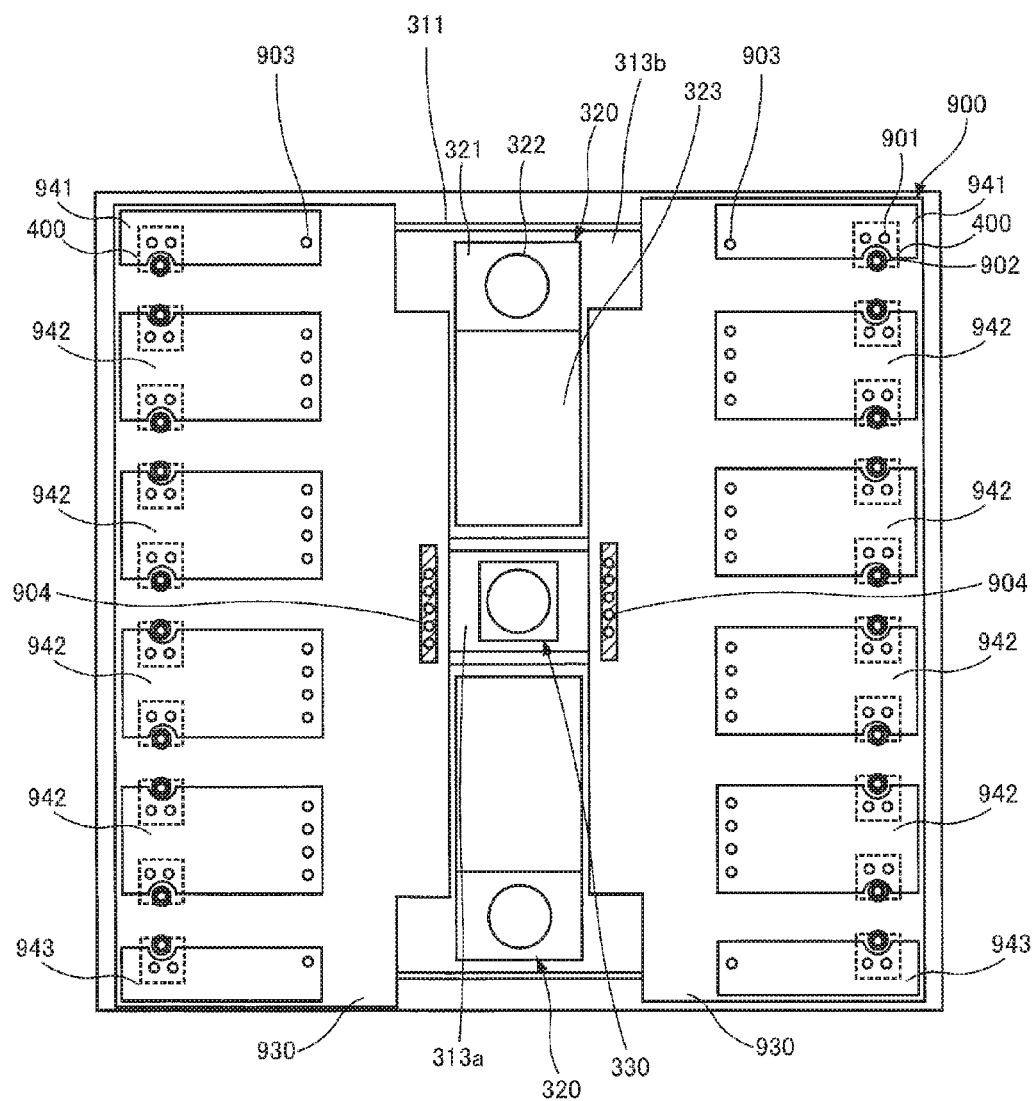
FIG. 11 is a top view (a back surface) of a print substrate of a semiconductor module of the second embodiment.

FIG. 11 is a top view (a back surface) of the print substrate of the semiconductor module of the second embodiment.

Print substrates 900 (as well as conductive posts 901 to 904) that are utilized by the semiconductor module of the second embodiment electrically connect the semiconductor chips 400 and the stacked substrate 310 (the gate circuit plate 313a and the circuit plate 313b) in the same way as the first embodiment.

Gate wiring layers 910 of the print substrates 900 are formed on front surfaces of insulation plates 930 as illustrated in FIG. 10. The gate wiring layers 910 electrically connect the conductive posts 902 and the conductive posts 904. Also, the conductive posts 904 are electrically connected with the gate circuit plate 313a, and the conductive posts 902 are electrically connected with the gate electrodes 400a of the semiconductor chips 400 (MOSFETs). That is, the gate terminal 330 and the gate electrodes 400a of the semiconductor chips 400 are electrically connected via the gate wiring layers 910. Also, each of the gate wiring layers 910 is configured with line portions 911a, 911b, 911c, 911d, 911e, line portions 912a, 912b, 912c, 912d, 912e, line portions 913a and 913c, a line portion 914b, and a line portion 915.

Also, source wiring layers 921, 922, 923 are formed on the front surfaces of the insulation plates 930 of the print substrates 900 as illustrated in FIG. 10, and source wiring layers 941, 942, 943 are formed on the back surfaces of the insulation plates 930 of the print substrates 900 as illustrated in FIG. 11.

These source wiring layers 921, 922, 923, 941, 942, 943 electrically connect the conductive posts 903 and the conductive posts 901. Also, the conductive posts 903 are electrically connected with the circuit plate 313b, and the conductive posts 901 are electrically connected with the source electrodes 400b of the semiconductor chips 400 (MOSFETs). That is, the circuit plate 313b and the source electrodes 400b of the semiconductor chips 400 are electrically connected via the source wiring layers 921, 922, 923, 941, 942, 943.

In the semiconductor module of the second embodiment as well, the case 700 surrounds the circumference as illustrated in FIGS. 1, 2A, and 2B in the same way as the first embodiment. Then, the lid 600 is attached to the upper portion in such a manner that the source terminals 320 and the gate terminal 330 are exposed from the opening 601 of the lid 600, and that the holes 602 of the lid 600 are adjusted to the positions of the screw holes 322 of the source terminals 320. Also, the gate supporting column 620 to which the gate contact 610 is attached is fitted into the fitting hole 331 of the gate terminal 330. Thereby, the semiconductor module of the second embodiment is built. Further, the cooling device 800 is attached to the back surface of the drain plate 200 as illustrated in FIGS. 2A and 2B.

Next, the gate wiring layers 910 formed in the print substrates 900 of the semiconductor module of the second embodiment will be described with reference to FIGS. 10 and 12A to 12D.

FIGS. 12A to 12D are cross-sectional views of a print substrate of the semiconductor module of the second embodiment.

Figure 12A:
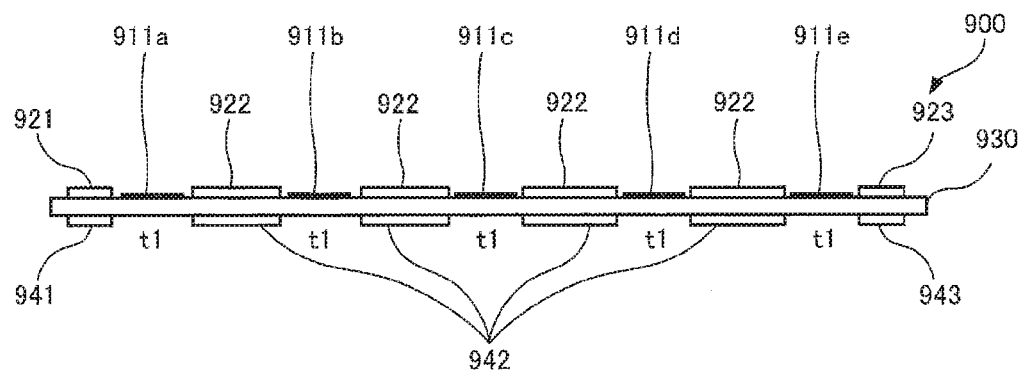
FIGS. 12A to 12D are cross-sectional views of a print substrate of a semiconductor module of the second embodiment.
Figure 12B:
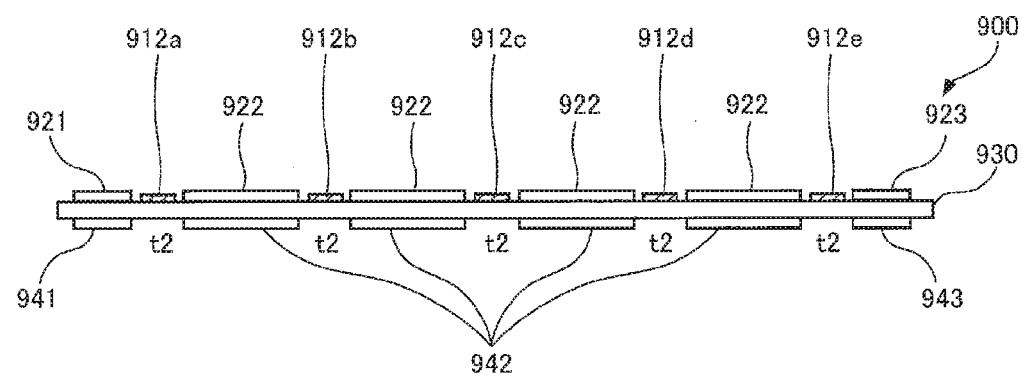
Figure 12C:
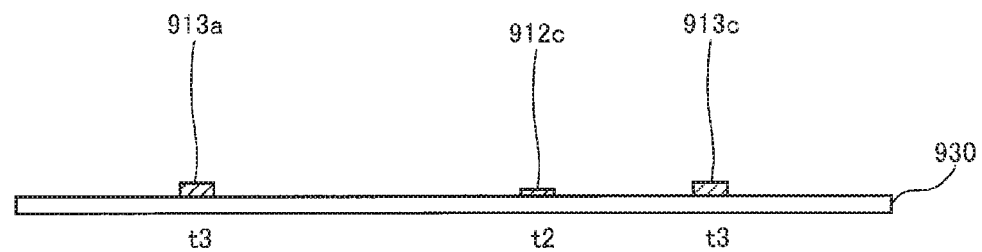
Figure 12D:
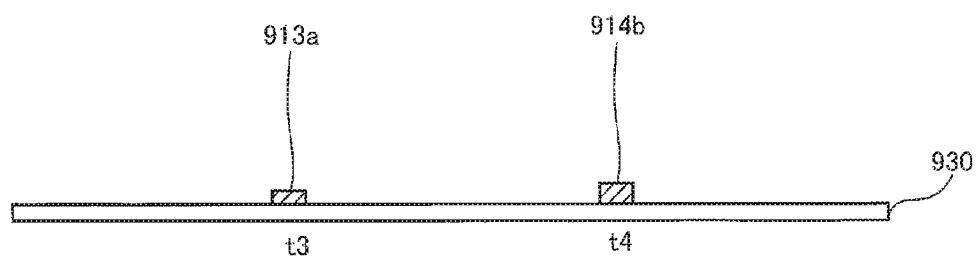

Note that FIG. 12A illustrates a cross-sectional view across a dot-and-dash line X2-X2 of FIG. 10, and FIG. 12B illustrates a cross-sectional view across a dot-and-dash line X3-X3 of FIG. 10, and FIG. 12C illustrates a cross-sectional view across a dot-and-dash line X4-X4 of FIG. 10, and FIG. 12D illustrates a cross-sectional view across a dot-and-dash line X5-X5 of FIG. 10.

Each of the gate wiring layers 910 of the print substrates 900 electrically connects the conductive posts 904 connected with the gate circuit plate 313a and the conductive posts 902 connected with the gate electrodes 400a of the semiconductor chips 400 as illustrated in FIG. 10. Each of the gate wiring layers 910 connected to the gate circuit plate 313a branches toward the gate electrodes 400a of the semiconductor chips 400 a plurality of times and is electrically connected to the gate electrodes 400a.

Also, each of the gate wiring layers 910 has a constant width from the gate electrodes 400a of the semiconductor chips 400 to the gate circuit plate 313a.

On the other hand, each of the line portions 911a, 911b, 911c, 911d, 911e of the gate wiring layers 910 electrically connects the gate electrodes 400a of a pair of adjacent semiconductor chips 400. Each of the line portions 911a, 911b, 911c, 911d, 911e has a thickness of t1 as illustrated in FIG. 12A.

Also, the line portion 912a branches to the gate electrodes 400a of the semiconductor chips 400 through the line portion 911a, and has a thickness t2 that is thicker than the thickness t1 of the line portion 911a as illustrated in FIG. 12B, in other words, has a thickness t2 (=t1*2) equal to a combination of the thicknesses t1 of the branched line portion 911a. In the same way, the line portions 912b, 912c, 912d, 912e also branch to the gate electrodes 400a of the semiconductor chips 400 through the line portions 911b, 911c, 911d, 911e, and have thicknesses that are thicker than the thickness t1 of the line portions 911b, 911c, 911d, 911e, in other words, have thicknesses t2 (=t1*2) equal to a combination of the thicknesses t1 of the branched line portions 911b, 911c, 911d, 911e.

Also, the line portion 913a branches to the line portions 912a and 912b. The line portion 913a has a thickness that is thicker than the thicknesses t2 of the line portions 912a and 912b as illustrated in FIG. 12C, in other words, has a thickness t3 (=t2*2=t1*4) equal to a combination of the thicknesses t2 f the branched line portions 912a and 912b. In the same way, the line portion 913c also branches to the line portions 912d and 912e, and has a thickness that is thicker than the thickness t2 of the line portions 912d and 912e, in other words, has a thickness t3 (=t2*2=t1*4) equal to a combination of the thicknesses t2 of the branched line portions 912d and 912e.

Note that the line portion 912c does not branch near the dot-and-dash line X4-X4, but extends from the line portion 911c without branching at the thickness t2 (=t1*2).

Further, the line portion 914b branches to the line portions 912c and 913c. The line portion 914b has a thickness that is thicker than the thickness of the line portions 912c and 913c as illustrated in FIG. 12D, in other words, has a thickness t4 (=t2+t3=t1*6) equal to a combination of the thickness t2 of the branched line portion 912c and the thickness t3 of the line portion 913c.

Note that the line portion 915 is electrically connected to the gate circuit plate 313a through the conductive posts 904. The line portion 915 is contiguous to the line portions 913a and 914b that differ in thickness, as in the upper side and the lower side in FIG. 10. Hence, the line portion 915 has a thickness t3 that is the same as the line portion 913a at the upper side in FIG. 10, and has a thickness t4 that is the same as the line portion 914b at the lower side in FIG. 10.

Thus, in the gate wiring layers 910, a control signal that is input from the conductive posts 904 separates to the line portion 913a (thickness t3=t1*4) and the line portion 914b (thickness t4=t1*6) via the line portion 915.

A control signal that passes through the line portion 913a separates to the line portions 912a and 912b (thickness t2=t1*2), and further separates to two routes through the line portions 911a and 911b (thickness t1), and is input into the gate electrodes 400a of the semiconductor chips 400.

On the other hand, a control signal that passes through the line portion 914b also separates to the line portion 912c (thickness t2=t1*2) and the line portion 913c (thickness t3=t1*4).

A control signal that passes through the line portion 912c separates to two routes through the line portion 911c (thickness t1) and is input into the gate electrodes 400a of the semiconductor chips 400.

A control signal that passes through the line portion 913c separates to the line portions 912d and 912e (thickness t2=t1*2), and further separates to two routes through the line portions 911d and 911e (thickness t1), and is input into the gate electrodes 400a of the semiconductor chips 400.

As described above, each of the gate wiring layers 910 formed on the front surfaces of the print substrates 900 is electrically connected to the gate circuit plate 313a, and branches toward the gate electrodes 400a of the semiconductor chips 400 a plurality of times, and is electrically connected to the gate electrodes 400a of the semiconductor chips 400. Also, when the line portion 911a has a thickness of t1 in a gate wiring layer 910 for example, the thickness t2 of the line portion 912a is a thickness (t1*2) equal to a combination of the thicknesses t1 of the line portion 911a that is branched from the line portion 912a. That is, when the line portion branches into two, the thickness of the branched line portion is a half of the thickness of the original line portion. As described above, the cross-sectional area of the gate wiring layer 910 for transmitting a control signal, i.e., the thickness of the line portion, becomes larger each time the line portion is merged as the line portion gets closer to the gate circuit plate 313a from the gate electrodes 400a of the semiconductor chips 400. That is, the thickness of the line portion becomes thicker in the second embodiment. Thereby, the density of electric charge that passes through the gate wiring layers 910 is constant regardless of position in the gate wiring layers 910. Hence, Joule heat generated in the gate wiring layers 910 is also constant and thus is prevented from becoming high abnormally in the gate wiring layers 910. Thus, the semiconductor module of the second embodiment is prevented from becoming less reliable, and its lifetime is made longer. Note that the thickness t1 of the line portion 911a is preferably from 0.1 mm to 1.65 mm.

[Third Embodiment]

A third embodiment will be described, taking an example in which a control signal is applied from a plurality of locations, and the thickness of a gate wiring layer is constant while the width of the gate wiring layer varies.

The print substrate of the third embodiment will be described with reference to FIGS. 13A and 13B.

Figure 13A:
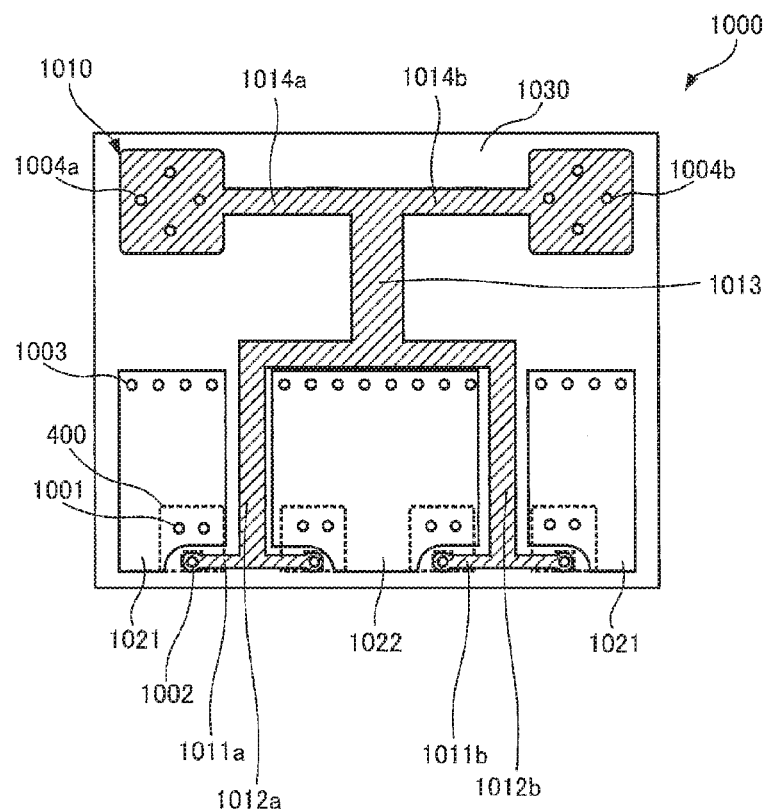
FIGS. 13A and 13B are diagrams for describing a print substrate of a semiconductor module of a third embodiment.
Figure 13B:
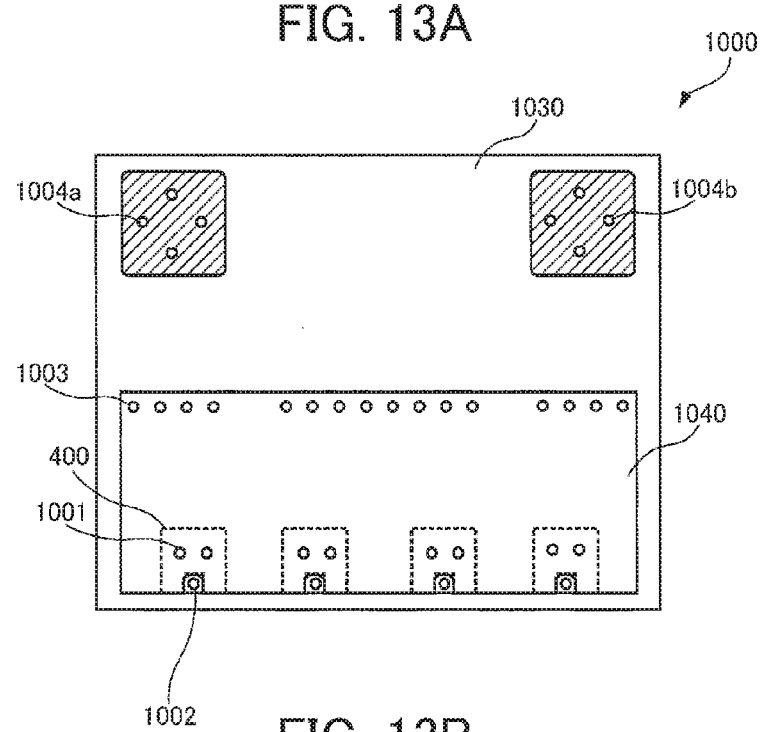

FIGS. 13A and 13B are diagrams for describing a print substrate of a semiconductor module of the third embodiment.

Note that FIG. 13A illustrates a gate wiring layer 1010 formed on a front surface of a print substrate 1000, and FIG. 13B illustrates a source wiring layer 1040 formed on a back surface of the print substrate 1000.

Also, the semiconductor module of the third embodiment has the same configuration as the first embodiment, except for the print substrates 500 and the gate circuit plate 313a of the semiconductor module 100 of the first embodiment. In the semiconductor module of the third embodiment, gate circuit plates (not illustrated) are provided at two locations corresponding to conductive posts 1004a and 1004b of the print substrate 1000, and are surrounded by the circuit plate 313b. Also, in the semiconductor module of the third embodiment, four semiconductor chips 400 are provided.

The print substrate 1000 (as well as the conductive posts 1001 to 1003, 1004a, and 1004b) that is utilized by the semiconductor module of the third embodiment electrically connects the semiconductor chips 400 and the stacked substrate 310 (the gate circuit plates and the circuit plate 313b) in the same way as the first embodiment.

The gate wiring layer 1010 is formed on a front surface of an insulation plate 1030 of the print substrate 1000 as illustrated in FIG. 13A. This gate wiring layer 1010 electrically connects the conductive posts 1004a and 1004b and the conductive posts 1002. Also, the conductive posts 1004a and 1004b are electrically connected with the respective gate circuit plates at two locations, and the conductive posts 1002 are electrically connected with the gate electrodes 400a of the semiconductor chips 400 (MOSFETs).

Also, source wiring layers 1021 and 1022 are formed on the front surface of the print substrate 1000 as illustrated in FIG. 13A. A source wiring layer 1040 is formed on the back surface of the print substrate 1000 as illustrated in FIG. 13B. These source wiring layers 1021, 1022, 1040 electrically connect the conductive posts 1001 and the conductive posts 1003. Also, the conductive posts 1003 are electrically connected with the circuit plate 313b, and the conductive posts 1001 are electrically connected with the source electrodes 400b of the semiconductor chips 400 (MOSFETs).

Next, the gate wiring layer 1010 formed on the print substrate 1000 of the semiconductor module of the third embodiment will be described with reference to FIG. 13A.

The gate wiring layer 1010 electrically connects the conductive posts 1004a connected with the gate circuit plates and 1004b at two locations and the conductive posts 1002 connected with the gate electrodes 400a of the semiconductor chips 400 as illustrated in FIG. 13A. The gate wiring layer 1010 connected to the gate circuit plates branches toward the gate electrodes 400a of the semiconductor chips 400 a plurality of times and is electrically connected to the gate electrodes 400a.

Also, the gate wiring layer 1010 has a constant thickness from the gate electrodes 400a of the semiconductor chips 400 (the conductive posts 1002) to the gate circuit plates (the conductive posts 1004a and 1004b).

On the other hand, each of line portions 1011a and 1011b of the gate wiring layer 1010 is electrically connected to the gate electrodes 400a of a pair of adjacent semiconductor chips 400. Also, both of the line portions 1011a and 1011b have widths of w1.

Also, a line portion 1012a branches to the gate electrodes 400a of a pair of adjacent semiconductor chips 400 through the line portion 1011a and is electrically connected to the gate electrodes 400a of the semiconductor chips 400. The width w2 of the line portion 1012a is wider than the width w1 of the line portion 1011a and is equal to a combination (w2=w1*2) of the widths w1 of the line portion 1011a. In the same way, a line portion 1012b also branches to the gate electrodes 400a of a pair of adjacent semiconductor chips 400 through the line portion 1011b and is electrically connected to the gate electrodes 400a of the semiconductor chips 400. Also, the width w2 of the line portion 1012b is equal to a combination (w2=w1*2) of the widths w1 of the line portion 1011b.

Also, a line portion 1013 branches to the line portions 1012a and 1012b. The width w3 of the line portion 1013 is wider than the line portions 1012a and 1012b and is equal to a combination (w3=w2*2=w1*4) of the widths w2 of the line portions 1012a and 1012b.

Also, line portions 1014a and 1014b branch from the line portion 1013 and are electrically connected to the conductive posts 1004a and 1004b respectively. The widths w4 of the line portions 1014a and 1014b are narrower than the line portion 1013 and are a half (w4=w3*½=w1*2) of the width w3 of the line portion 1013.

As described above, in the gate wiring layer 1010, control signals that are input from the conductive posts 1004a and 1004b pass through the line portions 1014a and 1014b and are merged at the line portion 1013. Hence, the width w3 (=w1*4) of the line portion 1013 is equal to a combination of the widths w4 (=w1*2) of the line portions 1014a and 1014b. Further, a control signal that passes through the line portion 1013 separates to the line portions 1012a and 1012b. Hence, the widths w2 (=w1*2) of the line portions 1012a and 1012b are equal to a half of the width w3 (=w1*4) of the line portion 1013. Then, the control signals pass through the line portions 1012a and 1012b respectively, and separate to two directions at the line portions 1011a and 1011b respectively, and are inputs into the gate electrodes 400a of the semiconductor chips 400. Hence, the widths w1 of the line portions 1011a and 1011b are equal to a half of the width w2 (w1*2) of the line portions 1012a and 1012b.

As described above, the gate wiring layer 1010 formed on the front surface of the print substrate 1000 is electrically connected to the gate circuit plates (the conductive posts 1004a and 1004b) at two locations, and branches toward the gate electrodes 400a of the semiconductor chips 400 (the conductive posts 1002) a plurality of times, and is electrically connected to the gate electrodes 400a of the semiconductor chips 400 (the conductive posts 1002). That is, the gate wiring layer 1010 electrically connects the gate circuit plates (the conductive posts 1004a and 1004b) at two locations and the gate electrodes 400a of the semiconductor chips 400 (the conductive posts 1002). Also, in the gate wiring layer 1010, when the line portion 1011a has a width of w1 for example, the width w2 of the line portion 1012a is equal to a combination (w1*2) of the widths w1 of the line portion 1011a that is branched from the line portion 1012a. That is, when the line portion branches into two, the width of the branched line portion is equal to a half of the width of the original line portion. Also, when the line portion 1013 (width w3 (=w1*4)) is branched to the line portions 1014a and 1014b connected electrically to the conductive posts 1004a and 1004b respectively, the widths w4 (=w1*2) of the line portions 1014a and 1014b are equal to a half of the width w3 of the line portion 1013.

Thus, in the gate wiring layer 1010, control signals are input from the respective conductive posts 1004a and 1004b and pass through the line portions 1014a and 1014b (width w =w1*2).

The control signals that pass through the line portions 1014a and 1014b are merged at the line portion 1013 (width w3=w1*4).

A control signal that passes through the line portion 1013 separates to the line portions 1012a and 1012b (width w2=t1*2), and further separates to two routes through the line portions 1011a and 1011b (width w1), and is input into the gate electrodes 400a of the semiconductor chips 400.

As described above, in the gate wiring layer 1010, the cross-sectional area of a line portion for transmitting a control signal, i.e., the width of the line portion, becomes larger, each time line portions are merged as the line portion gets closer to the gate circuit plates from the gate electrodes 400a of the semiconductor chips 400, and then the cross-sectional area of the line portion becomes smaller as the line portion branches to the gate circuit plates. That is, in the third embodiment, the width of the line portion is made wider and then is made narrower. Thereby, the density of electric charge that passes through the gate wiring layer 1010 is constant regardless of position in the gate wiring layer 1010. Hence, Joule heat generated in the gate wiring layer 1010 is also constant and thus is prevented from becoming high abnormally in the gate wiring layer 1010. Thus, the semiconductor module of the third embodiment is prevented from becoming less reliable, and its lifetime is made longer. Note that the width of the line portion 1011a is preferably from 0.1 mm to 1.65 mm.

Although the third embodiment has illustrated a case in which the width in the gate wiring layer 1010 is different like the first embodiment, but embodiments are not limit thereto, and the thicknesses in the gate wiring layer 1010 may be different like the second embodiment.

According to the disclosed technology, the semiconductor module generates Joule heat evenly to prevent decrease of reliability.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:
1. A semiconductor module comprising:
a plurality of semiconductor chips including gate electrodes on front surfaces;

a gate terminal configured to receive a control signal from outside; and a print substrate including a gate wiring layer for causing the control signal received by the gate terminal to separate and pass to the gate electrodes of the plurality of semiconductor chips, wherein a cross-sectional area of the gate wiring layer becomes larger as the cross-sectional area gets closer to the gate terminal from the gate electrodes.

2. The semiconductor module according to claim 1, further comprising:

a drain plate made of conductive material; and a stacked substrate including an insulation plate and a circuit plate stacked one on another, wherein the plurality of semiconductor chips further include source electrodes on the front surfaces and drain electrodes on back surfaces, the plurality of semiconductor chips and the stacked substrate are located on a front surface of the drain plate, the drain plate is electrically connected to the drain electrodes, and the gate wiring layer is electrically connected to the gate terminal via the circuit plate.

3. The semiconductor module according to claim 2, wherein the gate terminal is located on the circuit plate.

4. The semiconductor module according to claim 1, wherein the cross-sectional area of the gate wiring layer becomes larger, each time the gate wiring layer branches, as the gate wiring layer gets closer to the gate terminal from the gate electrodes.

5. The semiconductor module according to claim 1, wherein in the gate wiring layer, a line for transmitting the control signal becomes thicker as the line gets closer to the gate terminal from the gate electrodes.

6. The semiconductor module according to claim 1, wherein in the gate wiring layer, a line for transmitting the control signal becomes wider as the line gets closer to the gate terminal from the gate electrodes.

7. The semiconductor module according to claim 5, wherein in the gate wiring layer, a thickness of the line for transmitting the control signal is from 0.1 mm to 1.65 mm around the gate electrodes.

8. The semiconductor module according to claim 6, wherein in the gate wiring layer, a width of the line for transmitting the control signal is from 0.1 mm to 1.65 mm around the gate electrodes.

9. The semiconductor module according to claim 4, wherein the gate wiring layer has a tree structure.

* * * * *